United States Patent
Ganguli et al.

(10) Patent No.: US 8,637,390 B2
(45) Date of Patent: Jan. 28, 2014

(54) METAL GATE STRUCTURES AND METHODS FOR FORMING THEREOF

(75) Inventors: Seshadri Ganguli, Sunnyvale, CA (US); Sang Ho Yu, Cupertino, CA (US); Sang-Hyeob Lee, Fremont, CA (US); Hyoung-Chan Ha, San Jose, CA (US); Wei Ti Lee, San Jose, CA (US); Hoon Kim, San Jose, CA (US); Srinivas Gandikota, Santa Clara, CA (US); Yu Lei, San Jose, CA (US); Kevin Moraes, Fremont, CA (US); Xianmin Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 237 days.

(21) Appl. No.: 13/116,794

(22) Filed: May 26, 2011

(65) Prior Publication Data

US 2011/0298062 A1  Dec. 8, 2011

Related U.S. Application Data

(60) Provisional application No. 61/351,678, filed on Jun. 4, 2010.

(51) Int. Cl.
*H01L 21/4763* (2006.01)

(52) U.S. Cl.
USPC .......................................... 438/591; 438/592

(58) Field of Classification Search
USPC .............................. 438/275, 591–596, E21.19
See application file for complete search history.

(56) References Cited

U.S. PATENT DOCUMENTS

| 7,015,152 | B2 | | 3/2006 | Callegari et al. | |
| 7,563,678 | B2 * | | 7/2009 | Koyama et al. | 438/275 |
| 8,334,197 | B2 * | | 12/2012 | Lee et al. | 438/591 |
| 2005/0051854 | A1 | | 3/2005 | Cabral, Jr. et al. | |
| 2006/0017122 | A1 | | 1/2006 | Chau et al. | |
| 2006/0040482 | A1 | | 2/2006 | Yang et al. | |

OTHER PUBLICATIONS

International Search Report and Written Opinion mailed Jan. 9, 2012 for PCT Application No. PCT/US2011/038357.

* cited by examiner

*Primary Examiner* — Cuong Q Nguyen
(74) *Attorney, Agent, or Firm* — Moser Taboada; Alan Taboada

(57) ABSTRACT

Metal gate structures and methods for forming thereof are provided herein. In some embodiments, a method for forming a metal gate structure on a substrate having a feature formed in a high k dielectric layer may include depositing a first layer within the feature atop the dielectric layer; depositing a second layer comprising cobalt or nickel within the feature atop the first layer; and depositing a third layer comprising a metal within the feature atop the second layer to fill the feature, wherein at least one of the first or second layers forms a wetting layer to form a nucleation layer for a subsequently deposited layer, wherein one of the first, second, or third layers forms a work function layer, and wherein the third layer forms a gate electrode.

13 Claims, 5 Drawing Sheets

METAL GATE STRUCTURES AND METHODS FOR FORMING THEREOF

CROSS-REFERENCE TO RELATED APPLICATIONS

This application claims benefit of U.S. provisional patent application Ser. No. 61/351,678, filed Jun. 4, 2011, which is herein incorporated by reference.

FIELD

Embodiments of the present invention generally relate to substrate processing.

BACKGROUND

In the field of semiconductor, flat-panel display, or other electronic device processing, as the geometries of electronic devices continue to shrink and the density of devices continue to increase, overall feature size has decreased and aspect ratio has increased. In conventional device fabrication, for example when fabricating a metal gate structure in a two or three dimensional device, to fill smaller features, metal gate material is deposited via a high temperature deposition process atop a wetting layer. Additional layers may be needed, for example one or more barrier layers to prevent diffusion of the metal layer into underlying layers and one or more work function layers to provide a suitable work function for the device. However, the inclusion of the additional layers to perform the aforementioned functions makes it increasingly difficult to create devices having smaller geometries.

Therefore the inventors have provided an improved metal gate structure and methods for forming thereof.

SUMMARY

Metal gate structures and methods for forming thereof are provided herein. In some embodiments, a method for forming a metal gate structure on a substrate having a feature formed in a high k dielectric layer may include depositing a first layer within the feature atop the dielectric layer; depositing a second layer comprising cobalt within the feature atop the first layer; and depositing a third layer comprising a metal within the feature atop the second layer to fill the feature, wherein at least one of the first or second layers forms a wetting layer to form a nucleation layer for a subsequently deposited layer, wherein one of the first, second, or third layers forms a work function layer, and wherein the third layer forms a gate electrode.

In some embodiments, a method for forming a metal gate structure on a substrate having a feature formed in a high k dielectric layer may include depositing a first layer within the feature atop the dielectric layer, wherein the first layer is a barrier layer; depositing a second layer within the feature atop the first layer, wherein the second layer acts as a work function layer and a wetting layer to form a nucleation layer for a subsequently deposited layer; and depositing a third layer comprising aluminum (Al) within the feature atop the second layer to fill the feature, wherein the third layer forms a metal gate electrode.

In some embodiments a metal gate structure may include a first layer disposed within a feature formed in a dielectric layer of a substrate; a second layer comprising cobalt disposed above the first layer within the feature; and a third layer comprising a metal disposed above the second layer within the feature, wherein the third layer fills the feature, and wherein at least one of the first or second layers forms a wetting layer to form a nucleation layer for a subsequently deposited layer, wherein one of the first, second, or third layers forms a work function layer, and wherein the third layer forms a gate electrode.

In some embodiments, a metal gate structure may include a first layer disposed within a feature formed in a dielectric layer of a substrate, wherein the first layer is a barrier layer; a second layer disposed above the first layer within the feature, wherein the second layer is a work function layer and a wetting layer to form a nucleation layer for a subsequently deposited layer; and a third layer comprising aluminum disposed above the second layer within the feature, wherein the third layer forms a gate electrode.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
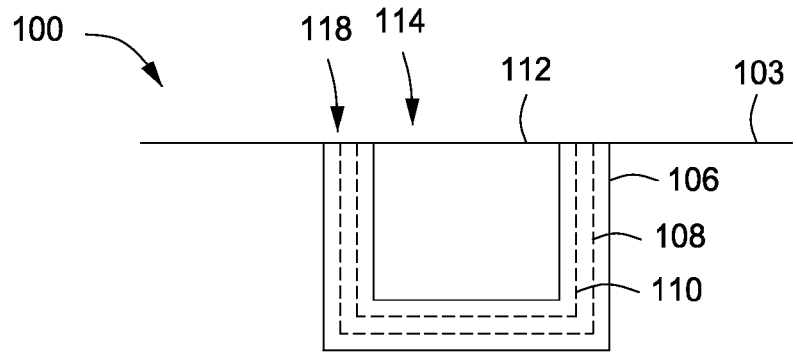
FIG. 1 is an illustrative cross sectional view of a substrate having a metal gate structure formed thereon in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to substrate processing. In some embodiments, the present inventive metal gate structures and methods of fabrication may advantageously provide a metal gate structure comprising wetting layer to facilitate nucleation and deposition of a metal gate layer thereon. In some embodiments, the wetting layer may further advantageously function as a barrier to prevent diffusion of material from the metal gate layer to underlying layers. The present invention may further advantageously provide a conformal and uniform wetting layer, thereby facilitating the formation of complex structures, for example a three dimensional structure, such as fin field effect transistor (fin FET) or a multiple gate field effect transistor.

Referring to FIG. 1, in some embodiments, a device 100 may include a metal gate structure 114, which may generally comprise a dielectric layer 103, a wetting layer 110, and metal gate layer 112. In some embodiments, the metal gate structure 114 may be disposed within or atop a substrate 102. In such embodiments, the metal gate structure 114 may be formed within a feature 118 formed, for example, in the dielectric layer 103 disposed atop the substrate 102. In addition, in some embodiments, the metal gate structure 114 may further comprise additional layers, for example at least one of a barrier layer 106 or work function layer 108.

The substrate 102 may be any substrate capable of having material deposited thereon, such as a silicon substrate, for example crystalline silicon (e.g., Si<100> or Si<111>), silicon oxide, strained silicon, doped or undoped polysilicon, or the like, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like.

In some embodiments, the substrate 102 may include other structures or features 118 at least partially formed therein. For example, in some embodiments, a feature 118 (e.g., a via, a trench, a dual damascene feature, high aspect ratio feature, or the like) may be formed within the dielectric layer 103 through any suitable process or processes, such as an etch process.

In some embodiments, the substrate 102 may include a p-type or n-type region defined therein (not shown). Alternatively, or in combination, in some embodiments, the substrate may include a plurality of field isolation regions (not shown) formed in the substrate 102 to isolate wells having different conductivity types (e.g., n-type or p-type) and/or to isolate adjacent transistors (not shown). The field isolation regions may be shallow trench isolation (STI) structures formed, for example, by etching a trench into the substrate 102 and then filling the trench with a suitable insulator, such as silicon oxide (oxide), silicon nitride (nitride), or the like.

The dielectric layer 103 may comprise any dielectric material suitable for a desired application. For example, in some embodiments, the dielectric layer 103 may comprise a high-K dielectric material, for example, having a dielectric constant equal to or greater than about 3.9. In some embodiments, the dielectric layer 103 is a metal silicate film, such as, for example, hafnium silicate (HfSiO$_x$), hafnium silicon nitride (Hf$_x$Si$_y$N), aluminum silicon oxynitride (AlSi$_x$O$_y$N$_z$), or the like. In some embodiments the high-K dielectric material may comprise a metal oxide, such as, for example hafnium oxide (HfO$_x$), zirconium oxide (ZrO$_x$), lanthanum oxide (LaO$_x$) aluminum oxide (Al$_x$O$_y$), combinations thereof, laminates thereof, mixtures thereof, or the like. The subscripts (x, y, z) imply that stoichiometry or composition may be intentionally varied via sequences of the cyclical deposition process to form the compounds.

The dielectric layer 103 may be formed via any process suitable to provide the dielectric layer 103 having a desired thickness. For example, in some embodiments, the dielectric layer 103 may be formed, at least in part, via a deposition process, such as chemical vapor deposition, physical vapor deposition, or a cyclical deposition process, for example, such as atomic layer deposition, or the like. Alternatively or in combination, in some embodiments, the dielectric layer 103 may be formed, at least in part, via a thermal or plasma oxidation process or the like. In some embodiments, the dielectric layer 103 may be formed via the process described below with respect to FIG. 2.

In some embodiments, the barrier layer 106 may be disposed above the dielectric layer 103. When present, the barrier layer 106 may prevent the diffusion of metal gate layer 112 material into the dielectric layer 103. The barrier layer 106 may comprise any material suitable to act as a barrier as described above. For example, in some embodiments, the barrier layer 106 may comprise a metal, for example, titanium (Ti), tantalum (Ta), cobalt (Co), manganese (Mn), tungsten (W), hafnium (Hf), alloys thereof, or the like, or in some embodiments, a metal nitride, such as titanium nitride (TiN), tantalum nitride (TaN), tungsten nitride (WN), or the like.

The barrier layer 106 may comprise any thickness suitable to prevent the diffusion of metal gate layer 112 materials into the dielectric layer 103. For example, in some embodiments, the barrier 106 layer may have a thickness of about 10 to about 50 Angstroms (Å). The barrier layer 106 may be formed by any process suitable to provide the barrier layer 106 having a desired thickness. For example, in some embodiments, the barrier layer 106 may be formed via a deposition process, such as chemical vapor deposition, physical vapor deposition, or a cyclical deposition process, for example, such as atomic layer deposition, or the like. In some embodiments, the barrier layer 106 may be formed via a process such as described below with respect to FIG. 2.

In some embodiments, the work function layer 108 may be disposed above the barrier layer 106. The work function layer 108 may comprise any material suitable to provide an appropriate work function range for the particular device being processed. For example, in embodiments where the metal gate structure 114 is an n-type metal-oxide semiconductor (nMOS), the work function layer 108 may comprise tantalum (Ta), titanium aluminum (TiAl), manganese (Mn), hafnium (Hf), hafnium aluminum (HfAl), or tantalum aluminum (TaAl). Alternatively, in embodiments where the metal gate structure 114 is a p-type metal oxide semiconductor (pMOS), the work function layer 108 may comprise titanium nitride (TiN), cobalt (Co), tungsten nitride (WN), nickel (Ni), or ruthenium (Ru).

The work function layer 108 may comprise any thickness suitable to provide the appropriate work function range for the particular device being processed. For example, in some embodiments, the work function layer 108 may comprise a thickness of about 20 to about 100 Angstroms (Å). The work function layer 108 may be formed by any process suitable to provide a work function layer 108 having a desired thickness. For example, in some embodiments, the work function layer 108 may be formed via a deposition process, such as chemical vapor deposition, physical vapor deposition, or a cyclical deposition process, for example, such as atomic layer deposition, or the like. In some embodiments, the work function layer 108 may be formed via a process such as described below with respect to FIG. 2.

In some embodiments, the wetting layer 110 is disposed above the work function layer 108. The wetting layer 110 provides a conformal layer within the feature 118 and acts as a nucleation layer to facilitate uniform deposition or growth of a subsequently formed layer (e.g., the metal gate layer 112).

The wetting layer 110 may comprise any thickness suitable to provide adequate uniform coverage of an underlying layer. For example, in some embodiments, the wetting layer 110 may comprise a thickness of about 5 to about 50 Angstroms (Å). The wetting layer 110 may be formed by any process suitable to provide a wetting layer 110 having a desired thickness. For example, in some embodiments, the wetting layer 110 may be formed via a deposition process, such as chemical vapor deposition, physical vapor deposition, or a cyclical deposition process, for example, such as atomic layer deposition, or the like. In some embodiments, the wetting layer 110 may be formed via a process such as described below with respect to FIG. 2.

The wetting layer 110 may comprise any material capable of forming a conformal layer within the feature 118 and suitable to function as a nucleation layer for the particular device being processed. For example, in some embodiments, for example where the metal gate structure 114 is a pMOS structure, the wetting layer 110 may comprise cobalt (Co) or alloys of cobalt and one or more transition metals (such as tantalum, hafnium, titanium, tungsten, or the like). The inventors have observed that although cobalt (Co) is a positive-type (p-type) metal and, therefore, suitable for use in a pMOS structure, a thin layer of cobalt (Co) may also be used as a wetting layer 110 in an nMOS metal gate structure 114. By providing a thin layer of cobalt (Co), the layer functions as a wetting layer to allow conformal deposition of a subsequently deposited layer without affecting the work function of the metal gate structure 114. Accordingly, in some embodiments, for example where the metal gate structure 114 is an nMOS structure the wetting layer 110 may comprise a layer of cobalt (Co) having a thickness of about 5 to about 30 Å, or in some embodiments, less than about 20 Å, or in some embodiments, less than about 15 Å or in some embodiments, less than about 10 Å.

In some embodiments, a metal gate layer 112 is disposed atop the wetting layer 110. The metal gate layer 112 may comprise any conductive material suitable for the particular device being fabricated. For example, in some embodiments, the metal gate layer 112 may comprise a metal, such as aluminum (Al), tungsten (W), copper (Cu), cobalt (Co), or nickel (Ni), or the like. The metal gate layer may comprise any thickness required to fill the feature 118, for example, in some embodiments the metal gate layer 112 may comprise a thickness of about 20 to about 300 Å.

The metal gate layer 112 may be formed by any process suitable to provide a metal gate layer 112 having a desired thickness. For example, in some embodiments, the metal gate layer 112 may be formed via a deposition process, such as chemical vapor deposition, physical vapor deposition, electroplating, or the like, or a cyclical deposition process, for example, such as atomic layer deposition, or the like. In some embodiments, the metal gate layer 112 may be formed via a process such as described below with respect to FIG. 2.

Although the work function layer 108, barrier layer 106, wetting layer 110 and metal gate layer 112 are described as separate layers, in some embodiments, one or more of work function layer 108, barrier layer 106, wetting layer 110 and metal gate layer 112 may function as at least one of a work function layer 108, barrier layer 106, wetting layer 110 or metal gate layer 112 thereby eliminating the need for a separate layer for each of the work function layer 108, barrier layer 106, wetting layer 110 and metal gate layer 112. For example, in some embodiments, the work function layer 108 may function as a barrier layer, thereby eliminating the need for a separate barrier layer 106. In some embodiments, for example, in embodiments where the metal gate structure 114 is a pMOS structure, the metal gate structure 114 may comprise a barrier layer 106 comprising titanium nitride (TiN) or tantalum nitride (TaN), a wetting layer 110 comprising cobalt and a metal gate layer 112 comprising tungsten or cobalt. In such embodiments, the TiN or TaN barrier layer 106 may function as the barrier layer 106 or as the barrier layer 106 and the work function layer 108. Accordingly, in such embodiments, the wetting layer 110 comprising cobalt may function as the wetting layer 110 or as the wetting layer 110 and work function layer 108.

In some embodiments, for example where the metal gate structure 114 is an nMOS structure, the barrier layer 106 may comprise TiN or TaN, the wetting layer 110 may comprise a single layer of cobalt and the work function layer 108 and metal gate layer 112 comprises a single layer of aluminum. In such embodiments, the TiN layer may comprise a thickness of about 8-10 Å and the cobalt layer comprises a thickness of about 10-15 Å. In another example, in some embodiments, the barrier layer 106, work function layer 108 and wetting layer 110 may comprise a single layer of tantalum. In such embodiments, the tantalum layer may comprise a thickness of about 30-50 Å. In another example, in some embodiments, the barrier layer 106 and the work function layer 108 may comprise tantalum and the wetting layer 110 may comprise a single layer of cobalt. In such embodiments, the tantalum layer may comprise a thickness of about 30-50 Å and the cobalt layer may comprise a thickness of about 10 Å. In another example, in some embodiments, the barrier layer 106 may comprise TiN and a single layer of TiAl may function as both the work function layer 108 and wetting layer 110 for an nMOS structure.

In addition, although the above description describes the describes the layers in a particular order (i.e., barrier layer 106, work function layer 108, wetting layer 110, metal gate layer 112) the layers may be provided in any order and each layer may function as at least one of a work function layer, barrier layer, wetting layer or metal gate layer, thereby eliminating the need for a separate layer to serve each of the aforementioned functions.

Figure 5:
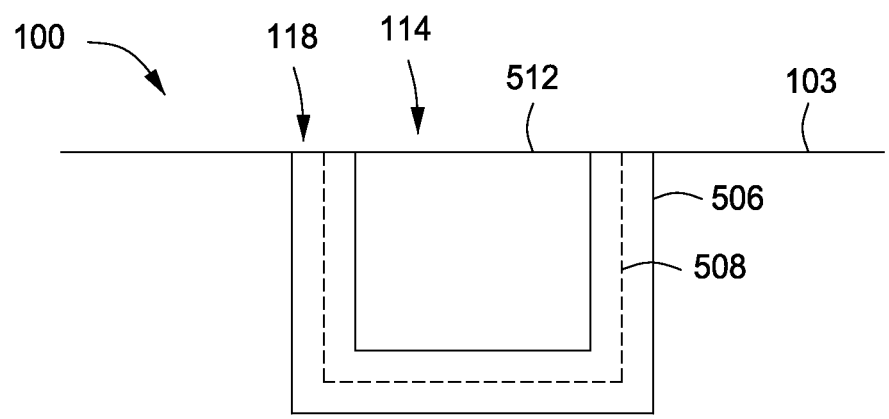
FIG. 5 is an illustrative cross sectional view of a substrate having a metal gate structure formed thereon in accordance with some embodiments of the present invention.

For example, in some embodiments, the metal gate structure 114 may comprise a first layer 506 formed within the feature 114 atop the dielectric layer 103, a second layer 508 comprising cobalt, and a third layer 512 within the feature 114 atop the second layer 508 to fill the feature 114, wherein at least one of the first layer 506 or second layer 508 forms a wetting layer and wherein one of the first layer 506, second layer 508, or third layer 512 forms a work function layer, as depicted in FIG. 5.

Figure 2:
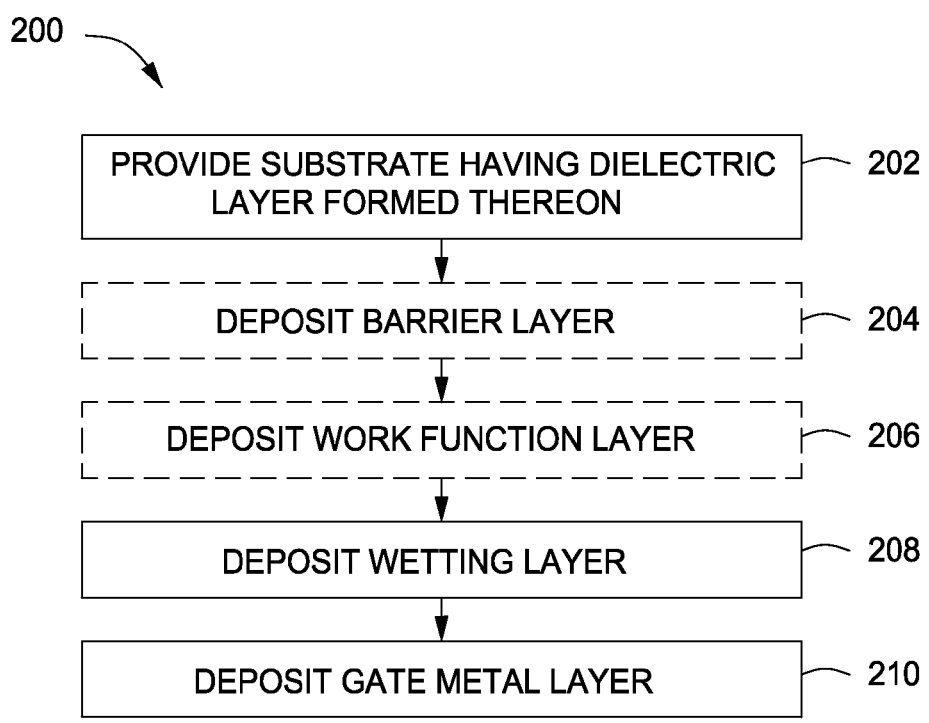
FIG. 2 depicts a method for forming a metal gate structure in accordance with some embodiments of the present invention.

FIG. 2 depicts a method for forming a metal gate structure on a substrate in accordance with some embodiments of the present invention. The method may be performed in any apparatus suitable for processing substrates in accordance with embodiments of the present invention, such as chemical vapor deposition chambers, physical vapor deposition chambers, and the like. Such apparatus may include standalone process chambers or process chambers coupled to a cluster tool. One example of a suitable cluster tool is described below with respect to FIG. 4.

Figure 3A:
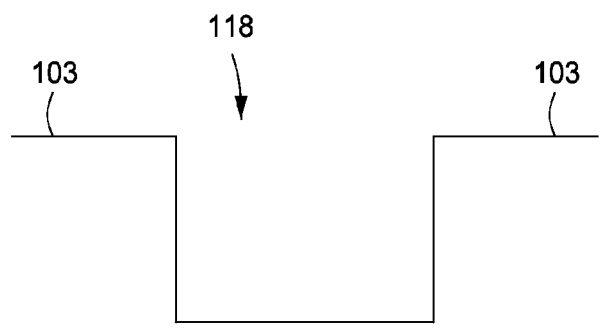
FIGS. 3A-E are illustrative cross-sectional views of a substrate during different stages of the processing sequence in accordance with some embodiments of the present invention.
Figure 3B:
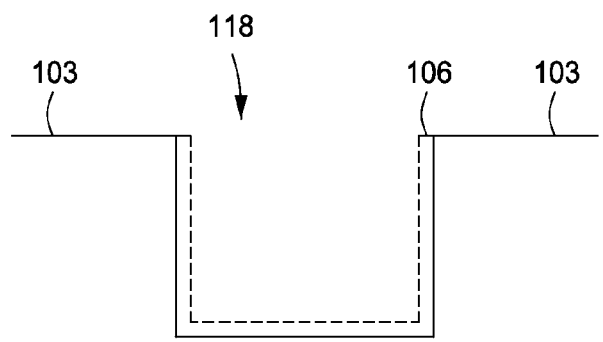
Figure 3C:
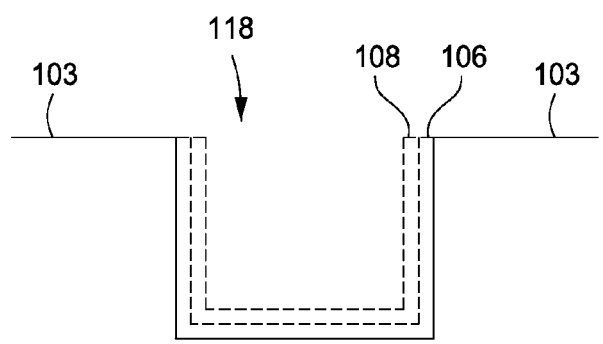
Figure 3D:
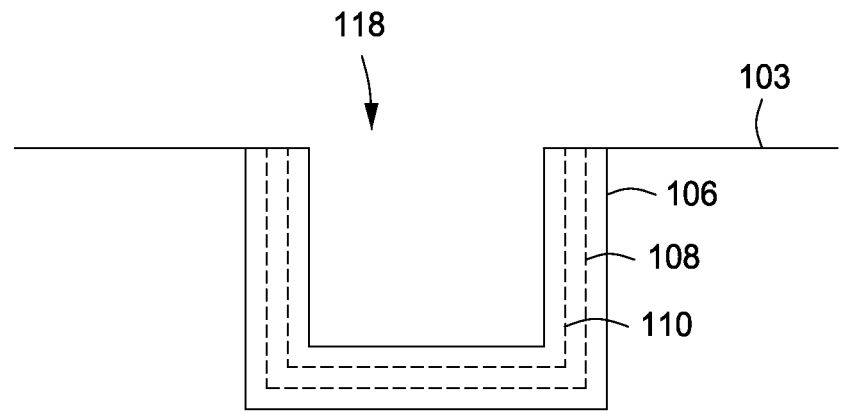
Figure 3E:
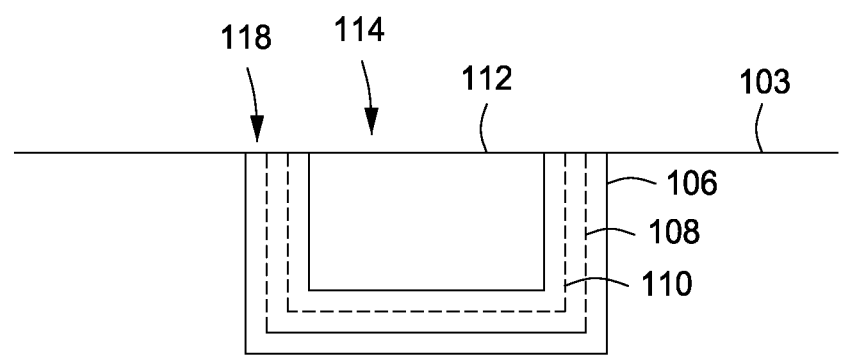

The method 200 begins at 202, where a substrate 102 having dielectric layer 103 formed thereon is provided, as depicted in FIG. 3A. The substrate 102 may be any substrate capable of having material deposited thereon, for example, any of the substrates described above. As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the dielectric layer 103, for example, by polishing, etching, reduction, oxidation, halogenation, hydroxylation, annealing, baking, or the like. In some embodiments, a feature 118 may be formed in the dielectric layer 103 disposed atop the substrate 102. The dielectric layer 103 may comprise any dielectric material, for example, any of the dielectric materials described above.

The dielectric layer 103 may be formed via any method, for example via chemical vapor deposition, or a cyclical deposition process, for example, such as atomic layer deposition, or the like. In some embodiments, the dielectric layer 103 may be formed to a thickness of about 5 to about 100 Å. In some embodiments, the thickness of the dielectric layer 103 deposited may be a function of its dielectric constant. For example, in some embodiments, the thickness of the dielectric layer 103 may be directly proportional to the dielectric constant. In some embodiments, the thickness may be based on an equivalent oxide thickness of the dielectric layer 103. In such embodiments, the equivalent oxide thickness may be defined as: (actual thickness of the dielectric layer 103)/(the dielectric constant of the material of the dielectric layer 103)*3/9. In some embodiments, the equivalent oxide thickness may be less than about 10 Å.

Next, at 204, in some embodiments, the barrier layer 106 may be formed atop the dielectric layer 103. The barrier layer 106 may be formed via any method suitable to provide a uniform conformal layer of material atop the dielectric layer 103. For example, the barrier layer 106 may be formed via a deposition process, such as chemical vapor deposition (CVD), physical vapor deposition (PVD), or a cyclical deposition process, for example, such as atomic layer deposition (ALD), or the like. By utilizing a deposition process such as CVD or ALD for formation of the barrier layer 106 (and subsequent layers as described below), the barrier layer 106 may be deposited in a substantially uniform conformal layer atop the dielectric layer 103, allowing the material to be deposited evenly within the entire feature 118, thereby facilitating the formation of a three dimensional structure, for example a Multiple Gate Field Effect Transistor (MuGFET) such as a FinFET, trigate, or the like. The deposition of the barrier layer 106 may be performed in a process chamber, for example such as described below with respect to FIG. 4.

The barrier layer 106 may comprise any material suitable to prevent the diffusion of material from subsequently deposited layers (e.g., the work function layer 108, wetting layer 110 or gate metal layer 112) into the dielectric layer 103. For example, in some embodiments, the barrier layer 106 may comprise any of the materials discussed above, such as a metal, for example, titanium (Ti), tantalum (Ta), cobalt (Co) or the like, or in some embodiments, a metal nitride, such as titanium nitride (TiN), tantalum nitride (TaN), tungsten nitride (WN), or the like.

In embodiments where the barrier layer 106 is deposited via a deposition process such as a CVD or ALD process the substrate 102 may be exposed to two or more process gases either simultaneously or sequentially. The two or more process gases react with the substrate 102 surfaces and/or each other, causing a deposition of material on the substrate 102, thereby forming the barrier layer 106.

In some embodiments, the two or more process gases may comprise a precursor and a process gas, respectively. For example, in embodiments where the barrier layer 106 comprises TaN, the precursor may comprise a tantalum precursor, for example, pentakis(dimethylamido)tantalum (PDMAT), tris(ethylmethylamido) tert-butylimido tantalum(V) (TBTEMT), or the like. In some embodiments, the process gas may comprise a hydrogen containing process gas, for example, hydrogen, ammonia ($NH_3$) or the like. In addition, in some embodiments, a temperature within the process chamber may be increased to further facilitate the reaction of the one or more process gases. For example, in some embodiments, the process chamber maintained at a temperature of about 150 to about 350 Celsius.

Alternatively, in embodiments where the barrier layer 106 comprises TiN, the substrate 102 may be exposed to a first process gas comprising a titanium-containing gas, and a second process gas comprising a nitrogen-containing gas. In such embodiments, the titanium-containing gas may comprise tetrachloride ($TiCl_4$), dimethylamino titanium (TDMAT), or tetrakis-ethylmethyl-amido titanium (TEMAT). Additionally, in such embodiments, the nitrogen-containing gas may comprise ammonia ($NH_3$), hydrazine ($N_2H_4$), or the like. In addition, in some embodiments, a temperature within the process chamber may be increased to further facilitate the reaction of the one or more process gases. For example, in some embodiments, the process chamber maintained at a temperature of about 150 to about 500 Celsius.

In some embodiments, the barrier layer 106 may be formed via a plasma assisted deposition process. For example, in such embodiments, the substrate 102 may be exposed to a precursor and plasma simultaneously or sequentially. The plasma may be formed by providing a plasma power, for example an RF power from a power source to ignite the process gas, thus forming the plasma. The plasma facilitates a decomposition of the precursor, causing a deposition of material on the substrate 102, thereby forming the barrier layer 106.

In some embodiments, for example where the barrier layer 106 comprises TaN, the precursor may comprise a Ta-halogen precursor, for example, such as tantalum fluoride ($TaF_5$), tantalum chloride ($TaCl_5$), or the like. In some embodiments, the plasma may be formed from a process gas comprising a hydrogen-containing gas, for example, such as a hydrogen ($H_2$) gas. In such embodiments, as a result of the decomposition of the Ta-halogen precursor facilitated by the plasma, a layer of Ta may be formed. Following the deposition, the Ta layer may be subsequently nitridized to form a barrier layer 106 comprising TaN. For example, the Ta layer may be exposed to a nitrogen-containing process gas, for example $N_2$, $NH_3$, $N_2H_4$, or the like and heated to a temperature of about 100 to about 500 degrees Celsius to facilitate nitridizing the Ta layer, thus forming the barrier layer 106 comprising TaN. Alternatively, in some embodiments, the Ta layer may be nitridized by exposing the Ta layer to a second plasma formed from the nitrogen-containing process gas, thereby nitridizing the tantalum layer, creating a barrier layer 106 comprising TaN.

Alternatively, in embodiments where the barrier layer 106 comprises TiN, the precursor may comprise a titanium precursor, for example, such as tetrakis dimethylamino titanium (TDMAT), titanium tetrachloride ($TiCl_4$), titanium tetra fluoride ($TiF_4$), or the like. In some embodiments, the plasma may be formed from a process gas comprising a hydrogen-containing gas, for example, such as a hydrogen ($H_2$) gas. In such embodiments, as a result of the decomposition of the titanium precursor facilitated by the plasma, a layer of titanium may be formed. Following the deposition, the titanium layer may be subsequently nitridized to form a barrier layer 106 comprising titanium nitride. For example, the Ti layer may be exposed to a nitrogen-containing process gas, for example $N_2$, $NH_3$, $N_2H_4$, or the like and heated to a temperature of about 100 to about 500 degrees Celsius to facilitate nitridizing the Ti layer, thus forming the barrier layer 106 comprising TiN. Alternatively, in some embodiments, the Ti layer may be nitridized by exposing the Ti layer to a second plasma formed from the nitrogen-containing process gas, thereby nitridizing the titanium layer, creating a barrier layer 106 comprising TiN.

Next, at 206, in some embodiments, an optional work function layer 108 may be deposited within the feature 118. In embodiments where the barrier layer 106 is present, the work function layer may 108 may be deposited atop the barrier layer 106.

The work function layer 108 may comprise any material suitable to provide an appropriate work function range for the particular device being processed, such as any of the materials described above. For example, in embodiments where the metal gate structure 114 is an n-type metal-oxide semiconductor (nMOS), the work function layer 108 may comprise tantalum (Ta), titanium (Ti), manganese (Mn), hafnium (Hf), aluminum (Al) and alloys thereof. Alternatively, in embodiments where the metal gate structure 114 is a p-type metal oxide semiconductor (pMOS), the work function layer 108 may comprise titanium nitride (TiN), cobalt (Co), tungsten nitride (WN), nickel (Ni), ruthenium (Ru), or the like.

The work function layer 108 may be formed via any method suitable to provide a uniform conformal layer of material within the feature 118. For example, the work function layer 108 may be formed via a deposition process, such as chemical vapor deposition (CVD), physical vapor deposition (PVD), or a cyclical deposition process, for example, such as atomic layer deposition (ALD), or the like. By utilizing a deposition process such as CVD or ALD for formation of the work function layer 108 (and subsequent layers as described below), the work function layer 108 may be deposited in a substantially uniform conformal layer, allowing the material to be deposited evenly within the entire feature 118, thereby facilitating the formation of a three dimensional structure, for example a Multiple Gate Field Effect Transistor (MuGFET) such as a FinFET, trigate, or the like. The deposition of the work function layer 108 may be performed in a process chamber, for example, such as one or more of the process chambers 432, 434, 436, 438 described below with respect to FIG. 4. The work function layer 108 may be deposited in the same, or in some embodiments a different, process chamber than utilized above with respect to the deposition of the barrier layer 106

In embodiments where the work function layer 108 is deposited via a deposition process such as a CVD or ALD process the substrate 102 may be exposed to two or more process gases either simultaneously or sequentially. The two or more process gases react with the substrate 102 surfaces and/or each other, causing a deposition of material on the substrate 102, thereby forming the work function layer 108.

In some embodiments, for example where metal gate structure 114 is an nMOS structure the work function layer 108 may be deposited by exposing the substrate 102 to a process gases comprising a precursor and a plasma sequentially. For example, in embodiments where the work function layer 108 comprises tantalum, the substrate 102 may first be exposed to a Ta-halogen precursor, for example, such as tantalum fluoride (TaF$_5$), tantalum chloride (TaCl$_5$), or the like. Alternatively, in embodiments where the work function layer 108 comprises titanium, the substrate 102 may first be exposed to a Ti precursor, for example such as tetrakis dimethylamino titanium (TDMAT), titanium tetrachloride (TiCl$_4$), titanium tetra fluoride (TiF$_4$), or the like. Following the exposure of the substrate to the precursor (i.e., the Ta-halogen precursor or Ti precursor) the substrate 102 may then be exposed to a plasma formed from a process gas comprising a hydrogen-containing gas, for example, such as a hydrogen (H$_2$), silane (SiH$_4$), or the like. In such embodiments, as a result of the decomposition of the precursor facilitated by the plasma, the work function layer 108 comprising may be formed. In some embodiments, one or more cycles of precursor and a plasma sequential exposure may be performed to deposit the work function layer 108 to a desired thickness, for example such as the thicknesses described above.

Alternatively, in embodiments where the work function layer 108 comprises manganese (Mn), the work function layer 108 may be exposed to a first process gas comprising a Mn-containing precursor, and a second process gas comprising a hydrogen-containing gas. For example, in such embodiments, the Mn-containing precursor may comprise a Mn amidinate precursor, for example, bis(N,N'-diisopropylpentylamidinato)manganese(II), or the like. In some embodiments, the hydrogen-containing gas may comprise hydrogen (H$_2$), silane (SiH$_4$), ammonia (NH$_3$), or the like. In such embodiments, as a result of decomposition of the Mn-containing precursor facilitated by the hydrogen containing gas, the work function layer 108 comprising Mn may be formed. In addition, in some embodiments, a temperature within the process chamber may be increased to further facilitate the reaction of the one or more process gases. For example, in some embodiments, the process chamber may be maintained at a temperature of about 250 to about 550 Celsius.

Alternatively, in embodiments where the work function layer 108 comprises cobalt (Co), the work function layer 108 may be deposited by exposing the substrate 102 to a first process gas comprising a Co-containing precursor and a second process gas comprising a hydrogen-containing gas. In some embodiments, the Co-containing precursor may comprise dicobalt hexacarbonyl t-butylacetylene (CCTBA), cobalt dicarbonyl cyclopentadienyl, or cobalt dicarbonyl allyl. In some embodiments, the hydrogen-containing gas may comprise hydrogen (H$_2$), ammonia (NH$_3$), or the like. In such embodiments, as a result of decomposition of the Co-containing precursor facilitated by the hydrogen containing gas, the work function layer 108 comprising Co may be formed. In addition, in some embodiments, a temperature within the process chamber may be increased to further facilitate the reaction of the one or more process gases. For example, in some embodiments, the process chamber may be maintained at a temperature of about 100 to about 450 Celsius.

Next, at 208, the wetting layer 110 may be deposited within the feature 118. In embodiments where the optional work function layer 108 is present, the wetting layer 110 may be deposited atop the work function layer 108. The wetting layer 110 may be deposited via any process suitable to provide a conformal and uniform layer with the feature 118, for example via a deposition process, such as chemical vapor deposition (CVD), physical vapor deposition (PVD), or a cyclical deposition process, for example, such as atomic layer deposition (ALD), or the like. By utilizing a deposition process such as CVD or ALD for formation of the wetting layer 110, the wetting layer 110 may be deposited in a substantially uniform conformal layer, allowing the material to be deposited evenly within the entire feature 118, thereby facilitating the formation of a three dimensional structure, for example a Multiple Gate Field Effect Transistor (MuGFET) such as a FinFET, trigate, or the like. The deposition of the wetting layer 110 may be performed in a process chamber, for example, such as one or more of the process chambers 436, 438, 434, 432 described below with respect to FIG. 4. The wetting layer 110 facilitates the nucleation and a uniform deposition of a subsequently deposited layer (e.g., the metal gate layer 112 described above and below). In some embodiments, the wetting layer 110 may also act as a barrier layer, eliminating the need for the barrier layer 106, described above.

The wetting layer 110 may comprise any material suitable to facilitate the nucleation and deposition of a layer subsequently deposited thereon. For example, in some embodiments the wetting layer 110 may comprise cobalt (Co), tantalum (Ta), a tantalum-aluminum alloy (Ta—Al), manganese (Mn), a hafnium (Hf), hafnium aluminum alloy (Hf—Al), titanium (Ti), a titanium-aluminum alloy (Ti—Al), or the like. The wetting layer 110 may comprise any thickness suitable for the structure being fabricated. For example, the wetting layer 110 may comprise any of the thicknesses discussed above with respect to FIG. 1.

In some embodiments, for example where the wetting layer 110 comprises Co, the wetting layer 110 may be deposited by exposing the substrate 102 to a first process gas comprising a Co-containing precursor and a second process gas comprising a hydrogen-containing gas, for example, such as described above with respect to the formation of the work function layer 108. In some embodiments, for example where the metal gate structure 114 is a pMOS structure, the cobalt may be deposited to form a wetting layer 110 having a thickness of greater than about 20 Å. In such embodiments, the cobalt functions both the wetting layer 110 and work function layer, thereby eliminating the need to deposit a separate work function layer 108 as described above. Alternatively, in embodiments where the metal gate structure 114 is an nMOS structure, the cobalt may be deposited to form a wetting layer having a thickness of less than about 20 Å, or in some embodiments, less than about 10 Å.

In some embodiments, for example where the wetting layer 110 comprises Ta or a Ta—Al alloy, the wetting layer 110 may be formed via a plasma assisted deposition process, for example a plasma enhanced atomic layer deposition process (PEALD). For example, in such embodiments, the substrate 102 may be exposed to one or more precursors or process gases and plasma simultaneously or sequentially. The plasma may be formed by providing a plasma power, for example an RF power from a power source to ignite the process gas, thus forming the plasma. The plasma facilitates a decomposition of the precursor, causing a deposition of material within the feature 118, thereby forming the barrier layer 106.

In some embodiments, for example where the wetting layer 110 comprises Ta, the one or more process gases may comprise a Ta-containing process gas, for example, such as tantalum fluoride ($TaF_5$), tantalum chloride (TaCl), or the like or a Ta-containing precursor, such as pentakis(dimethylamido) tantalum (PDMAT), Tris(ethylmethylamido) tert-butylimido tantalum(V) (TBTEMT), or the like. Alternatively, or in addition, in embodiments where the wetting layer 110 comprises a Ta—Al alloy, the one or more process gases or precursors may additionally comprise an Al-containing precursor, for example such as tritertiarybutylaluminium (TTBA), trimethylaluminum (TMA), triethyl aluminum (TEA), or the like. In some embodiments, the plasma may be formed from a process gas comprising a hydrogen-containing gas, for example, such as a hydrogen ($H_2$), silane ($SiH_4$), or the like. In such embodiments, as a result of the decomposition of the one or more precursors or process gases facilitated by the plasma, a wetting layer 110 layer comprising Ta or Ta—Al may be formed.

In some embodiments, for example where the wetting layer 110 comprises Ti, the one or more process gases may comprise a Ti-containing precursor, for example, such as tetrakis dimethylamino titanium (TDMAT), titanium tetrachloride ($TiCl_4$), titanium tetra fluoride (TiF4), or the like. Alternatively, or in addition, in embodiments where the wetting layer 110 comprises a Ti—Al alloy, the one or more process gases or precursors may additionally comprise an Al-containing precursor, for example such as tritertiarybutylaluminium (TTBA), trimethylaluminum (TMA), triethyl aluminum (TEA), or the like. In some embodiments, the plasma may be formed from a process gas comprising a hydrogen-containing gas, for example, such as a hydrogen ($H_2$), silane (SiH4), or the like. In such embodiments, as a result of the decomposition of the one or more precursors or process gases facilitated by the plasma, a wetting layer 110 layer comprising Ti or Ti—Al may be formed.

In some embodiments, for example where the wetting layer 110 comprises Hf, the one or more process gases may comprise a Hf-containing precursor, for example, halides of hafnium, such as hafnium chloride, or the like. Alternatively, or in addition, in embodiments where the wetting layer 110 comprises a Hf—Al alloy, the one or more process gases or precursors may additionally comprise an Al-containing precursor, for example such as tritertiarybutylaluminium (TTBA), trimethylaluminum (TMA), triethyl aluminum (TEA), or the like. In some embodiments, the plasma may be formed from a process gas comprising a hydrogen-containing gas, for example, such as a hydrogen ($H_2$), silane (SiH4), or the like. In such embodiments, as a result of the decomposition of the one or more precursors or process gases facilitated by the plasma, a wetting layer 110 layer comprising Hf or Hf—Al may be formed.

In some embodiments, for example where the wetting layer 110 comprises Mn, the wetting layer 110 may be deposited via the process as described above with respect to the formation of the work function layer 108.

Next, at 210, the metal gate layer 112 may be formed atop the wetting layer 110. The metal gate layer 112 may comprise any conductive material suitable for the particular device being fabricated, for example, the materials discussed above. In some embodiments, metal gate layer 112 may comprise a metal, such as aluminum (Al), tungsten (W), copper (Cu), cobalt (Co), or the like. The metal gate layer 112 may be formed by any process suitable to provide a metal gate layer 112 having a desired thickness. For example, in some embodiments, the metal gate layer 112 may be formed via a deposition process, such as chemical vapor deposition, physical vapor deposition, electroplating, or the like, or a cyclical deposition process, for example, such as atomic layer deposition, a combination thereof, or the like. The deposition of the barrier layer 108 may be performed in a process chamber, for example, such as one or more of the process chambers 432, 434, 436, 438 described below with respect to FIG. 4.

In some embodiments, for example where the metal gate layer 112 is formed may be formed via a CVD process, the substrate 102 may be exposed to one or more precursors. For example, in embodiments where the metal gate layer 112 comprises Al, the substrate may be exposed to an Al-containing precursor, for example, such as trimethylaminealaneborane (TMMAB), methylpyrroridine alane (MPA), dimethylaluminumhydride (DMAH), or the like.

In some embodiments, following the deposition of the metal gate layer 112 via the CVD process as described above, a physical vapor deposition process may be performed to facilitate further depositing metal gate layer 112 material and a reflow of the metal gate layer 112 material, thereby providing a uniform and consistent metal gate layer 112.

After deposition of the metal gate layer 112 at 210, the method generally ends. In some embodiments, additional fabrication steps may be performed to complete fabrication of the structure or device being formed. For example, further fabrication steps may include removing the bulk dielectric layer 103 via, for example, an etch process to expose the metal gate structure 114. In some embodiments, excess material may be removed from the upper surface of the substrate, for example, via a chemical metal polishing (CMP) process.

Although the above method is described as depositing layers in one particular sequence (i.e., optionally depositing barrier layer 106 at 204, optionally depositing work function layer 108 at 206, depositing wetting layer 110 at 208 and depositing gate metal layer 112 at 210), the layers may be deposited in any order and each layer may provide multiple functions. For example, in some embodiments, a single layer may provide the functions of one or more of the work function layer 108, barrier layer 106, wetting layer 110 and metal gate layer 112, thereby eliminating the need for a separate layer for each of the work function layer 108, barrier layer 106, wetting layer 110 and metal gate layer 112.

For example, in some embodiments, such as where the metal gate structure 114 is an nMOS structure, a first layer comprising one of titanium (Ti), tantalum (Ta), titanium nitride (TiN) or tantalum nitride (TaN) may first be deposited atop the dielectric layer 103 (i.e., a high-K dielectric layer such as hafnium oxide ($HfO_2$)) to form the barrier layer 106. Following the deposition of the first layer, a second layer comprising cobalt (Co) may be deposited atop the barrier layer 106 to form the wetting layer 110. In such applications, the inventors have observed that although cobalt (Co) is a positive-type (p-type) metal and, therefore, suitable for use in a pMOS structure, a thin layer of cobalt (Co) may also be used as a wetting layer 110 in an nMOS metal gate structure 114. By providing a thin layer of cobalt (Co), the layer functions as a wetting layer to allow conformal deposition of a subsequently deposited layer without affecting the work function of the metal gate structure 114. Accordingly, in such embodiments, the cobalt (Co) wetting layer 110 may be deposited to a thickness of less than about 20 Å, or in some embodiments, less than about 15 Å or in some embodiments, less than about 10 Å. Following the deposition of the cobalt (Co) wetting layer 110, in some embodiments, a third layer comprising aluminum (Al) may be deposited atop the wetting layer 110 to fill the feature 118 and function as a metal gate layer 112. By providing an aluminum (Al) layer as a metal gate layer 112, the overall resistivity of the metal gate structure 114 is remains low, thereby increasing the efficiency of the metal gate structure 114.

In another example, in some embodiments, such as where the metal gate structure 114 is an nMOS structure, a first layer comprising one of titanium nitride (TiN) or tantalum nitride (TaN) may first be deposited atop the dielectric layer 103 (i.e., a high-K dielectric layer such as hafnium oxide ($HfO_2$)) to form the barrier layer 106. Following the deposition of the first layer, a second layer comprising one of manganese (Mn), hafnium (Hf), titanium (Ti), tantalum (Ta), or aluminum alloys thereof may be deposited atop the first layer, wherein the second layer functions as a work function layer 108 and a wetting layer 110. Following the deposition of the second layer, a third layer comprising aluminum (Al) is deposited atop the second layer to fill the feature 114, wherein the third layer functions as a metal gate layer 112.

In some embodiments, such as where the gate metal structure 114 is a pMOS structure, a first layer comprising one of titanium nitride (TiN) or tantalum nitride (TaN) may first be deposited atop the dielectric layer 103 (i.e., a high-K dielectric layer such as hafnium oxide ($HfO_2$)) to form the barrier layer 106 and/or a wetting layer 110. Following the deposition of the first layer, a second layer comprising cobalt (Co) may be deposited to form the work function layer 108 and/or wetting layer 110. In some embodiments, the second layer comprising cobalt (Co) may be deposited to a thickness of about 5 to about 70 Å, or about 50 Å. Following the deposition of the second layer, a third layer comprising one of copper (Cu), tungsten (W), cobalt (Co) or aluminum (Al) may be deposited atop the second layer to fill the feature 114, wherein the third layer functions as a metal gate layer 112. In some embodiments, where the third layer comprises cobalt (Co), the second layer and third layer may be deposited as one continuous layer. Alternatively, in some embodiments, where the third layer comprises cobalt (Co), the second layer and third layer may be deposited as separate layers.

Figure 4:
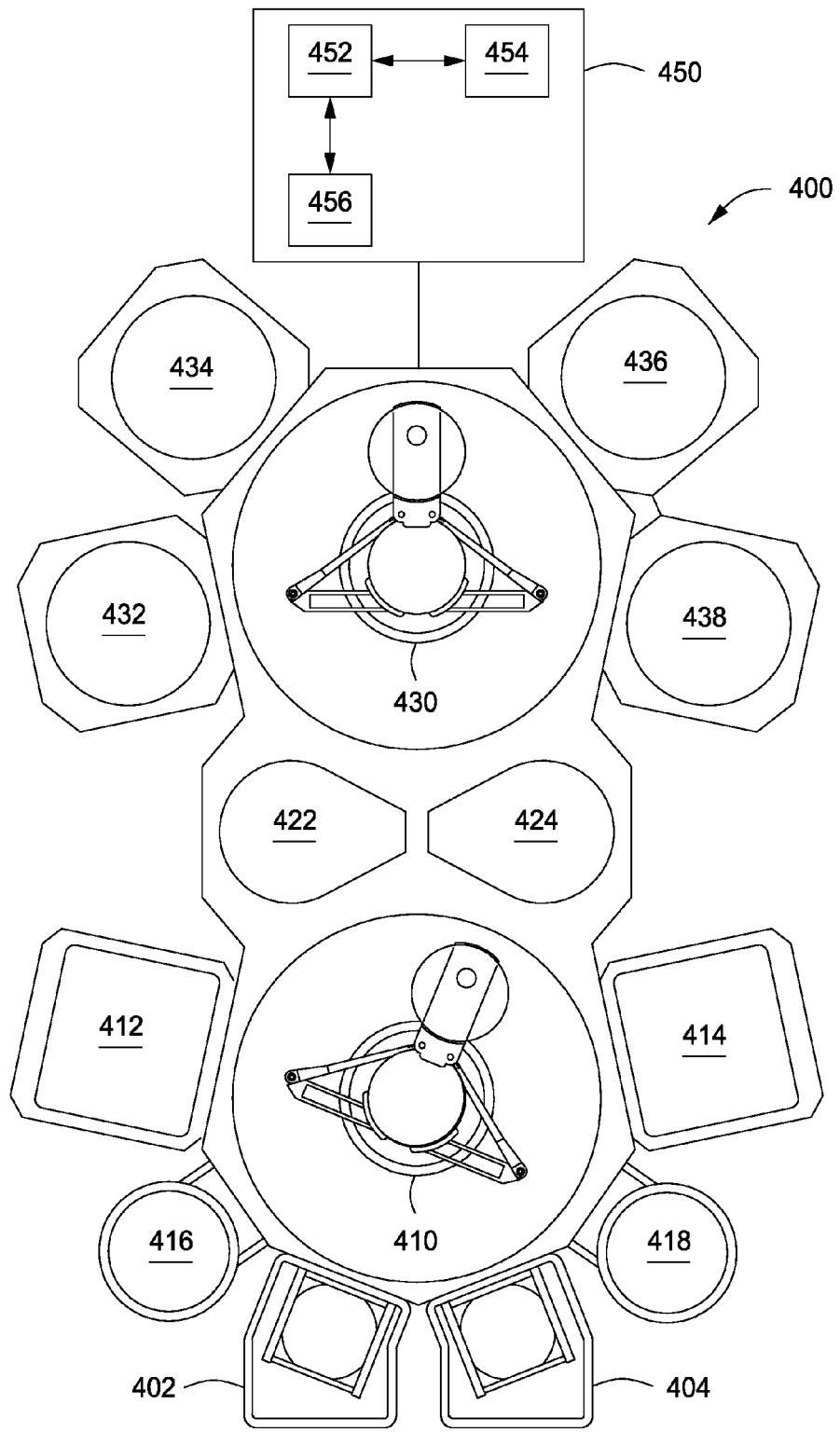
FIG. 4 is a schematic top view diagram of one example of a multi-chamber processing system which may be adapted to perform the processes disclosed herein.

FIG. 4 is a schematic top-view diagram of an exemplary multi-chamber processing system 400 that may be adapted to perform the processes disclosed herein. Examples of suitable multi-chamber processing systems include the ENDURA®, CENTURA®, and PRODUCER® processing systems, commercially available from Applied Materials, Inc. Another similar multi-chamber processing system that may be adapted to benefit from the invention is disclosed in U.S. Pat. No. 5,186,718, entitled "Stage Vacuum Wafer Processing System and Method," issued on Feb. 16, 1993, which is incorporated by reference herein.

The system 400 generally includes load lock chambers 402, 404 for the transfer of substrates (such as substrates 102 described above) into and out from the system 400. Since the system 400 is operated under vacuum, the load lock chambers 402, 404 may be "pumped down" to maintain to facilitate entry and egress of substrates to the system. A first robot 410 may transfer the substrate between the load lock chambers 402, 404, processing chambers 412, 414, transfer chambers 422, 424, and other chambers 416, 418. A second robot 430 may transfer the substrate between processing chambers 432, 434, 436, 438 and the transfer chambers 422, 424. Furthermore, each processing chamber 412, 414, 416, and 418 may be outfitted to perform a number of substrate processing operations such as cyclical layer deposition including atomic layer deposition (ALD), chemical vapor deposition (CVD), physical vapor deposition (PVD), etch, pre-clean, de-gas, orientation and other substrate processes. At least some of the chambers 412, 414, 416, 418, 432, 434, 436, 438 are configured to perform the processes described herein.

The first robot 410 may transfer substrates to or from one or more transfer chambers 422 and 424. The transfer chambers 422 and 424 are used to maintain ultrahigh vacuum conditions while allowing substrates to be transferred within the system 400. A second robot 430 may transfer substrates between the transfer chambers 422 and 424 and a second set of one or more processing chambers 432, 434, 436 and 438. Similar to processing chambers 412, 414, 416, and 418, the processing chambers 432, 434, 436, and 438 can be outfitted to perform a variety of substrate processing operations, such as cyclical layer deposition including atomic layer deposition (ALD), chemical vapor deposition (CVD), physical vapor deposition (PVD), etch, pre-clean, de-gas, and orientation. Any of the substrate processing chambers 412, 414, 416, 418, 432, 434, 436, and 438 may be removed from the system 400 if not necessary for a particular process to be performed by the system 400. In some embodiments, at least some of the substrate processing chambers 412, 414, 416, 418, 432, 434, 436, and 438 may be configured as necessary to perform the various processes discussed above in order to perform the inventive methods disclosed herein within the system 400. For example, in some embodiments, one or more of the substrate processing chambers 412, 414, 416, 418, 432, 434, 436, and 438 may be configured to perform an atomic layer deposition or chemical vapor deposition process, for example, as discussed above with respect to the deposition of the barrier layer 106, work function layer 108, wetting layer 110. In addition, in some embodiments, one or more of the substrate processing chambers 412, 414, 416, 418, 432, 434, 436, and 438 may be configured to perform a physical vapor deposition process, for example, as described above with respect to the deposition of the gate metal layer 112.

The processing system 400 may include one or more pre-clean chambers to preclean the substrate transferring into the chambers, one or more PVD chambers configured to deposit barrier layers, seed layers, or conductive metal layers. To enhance efficiency and throughput of the system, one configuration of the processing system includes two precleaning chambers, such as precleaning chambers 412, 414 configured to pre-clean the substrate surface, four ALD or PVD chambers, such as processing chambers 434, 436, 432, 438, configured to deposit barrier layers or to deposit seed layers disposed in connection to the back-end central transfer chamber. In some embodiments, the chambers 412, 414 are configured as precleaning chambers while the processing chambers 432, 434, 438, 438 are configured to deposit at least TiN by a PVD process.

A controller 450 may be provided and coupled to the system 400 for controlling the components of the system. The controller 450 may be any suitable controller for a controlling the operation of a substrate process chamber or cluster tool. The controller 450 generally includes a central processing unit (CPU) 452, a memory 454, and support circuits 456. The CPU 452 may be any form of a general purpose computer processor that can be used in an industrial setting. The support circuits 456 are coupled to the CPU 452 and may comprise cache, clock circuits, input/output subsystems, power supplies, and the like. Software routines, such as the methods for processing substrates disclosed herein, for example with respect to FIGS. 2 and 3A-E, may be stored in the memory 454 of the controller 450. The software routines, when executed by the CPU 452, transform the CPU 452 into a specific purpose computer (controller) 450. The software routines may also be stored and/or executed by a second controller (not shown) that is located remotely from the controller 450. Alternatively or in combination, each process chamber of the system 400 may have its own controller for controlling portions of the inventive methods disclosed herein that may be performed in that particular process chamber. In such embodiments, the individual controllers may be configured similar to the controller 450 and may be coupled to the controller 450 to synchronize operation of the system 100.

Thus, metal gate structures and methods for forming thereof are provided herein. The inventive metal gate structure and method may advantageously provide a wetting layer to facilitate nucleation and deposition of a metal gate layer thereon. The wetting layer may further advantageously provide a barrier to prevent diffusion of material from the metal gate layer to underlying layers. The inventive method may further advantageously provide a conformal and uniform wetting layer, thereby facilitating the formation of complex structures, for example a three dimensional structure, such as fin field effect transistor or a multiple gate field effect transistor.

While the foregoing is directed to embodiments of the present invention, other and further embodiments of the invention may be devised without departing from the basic scope thereof.

The invention claimed is:

1. A method for forming a metal gate structure on a substrate having a feature formed in a high k dielectric layer, comprising:
    depositing a first layer within the feature atop the dielectric layer;
    depositing a second layer comprising cobalt or nickel within the feature atop the first layer; and
    depositing a third layer comprising a metal within the feature atop the second layer to fill the feature, wherein at least one of the first or second layers forms a wetting layer to form a nucleation layer for a subsequently deposited layer, wherein one of the first, second, or third layers forms a work function layer, and wherein the third layer forms a metal gate electrode.

2. The method of claim 1, wherein the dielectric layer comprises one of hafnium silicon oxide (HfSiO), hafnium silicon nitride (HfSiN), aluminum silicon oxynitride (AlSiON), hafnium oxide (HfO), zirconium oxide (ZrO), lanthanum oxide (LaO), aluminum oxide (AlO).

3. The method of claim 1, wherein forming the metal gate structure comprises forming a pMOS metal gate structure, and wherein depositing the first layer comprises depositing a layer comprising one of titanium (Ti), tantalum (Ta), titanium nitride (TiN), or tantalum nitride (TaN).

4. The method of claim 3, wherein the first layer forms at least one of a barrier layer or work function layer.

5. The method of claim 1, wherein forming the metal gate structure comprises forming a pMOS metal gate structure, and wherein depositing the second layer comprising cobalt (Co) or nickel (Ni) comprises depositing the second layer to a thickness of about 5 to about 70 Å.

6. The method of claim 1, wherein forming the metal gate structure comprises forming an nMOS structure, and wherein depositing the first layer comprises depositing a layer comprising one of manganese (Mn), hafnium (Hf), titanium (Ti), tantalum (Ta), aluminum alloys thereof, titanium nitride (TiN), or tantalum nitride (TaN).

7. The method of claim 6, wherein the first layer forms at least one of a barrier layer or work function layer.

8. The method of claim 1, wherein forming the metal gate structure comprises forming an nMOS structure, and wherein the second layer comprising cobalt (Co) or nickel (Ni) is deposited to a thickness of less than about 20 Å.

9. The method of claim 1, wherein depositing the third layer comprises depositing a metal gate layer comprising aluminum (Al), tungsten (W), cobalt (Co), copper (Cu), or nickel (Ni).

10. The method of claim 1, wherein depositing the third layer comprises:
    depositing a first sublayer comprising aluminum (Al) via chemical vapor deposition;
    depositing a second sublayer comprising aluminum (Al) via physical vapor deposition, wherein depositing the second sublayer causes a reflow of the first sublayer, and wherein the first sublayer and second sublayer form a metal gate layer.

11. A method for forming a metal gate structure on a substrate having a feature formed in a high k dielectric layer, comprising:
    depositing a first layer within the feature atop the dielectric layer, wherein the first layer is a barrier layer;
    depositing a second layer within the feature atop the first layer, wherein the second layer acts as a work function layer and a wetting layer to form a nucleation layer for a subsequently deposited layer; and
    depositing a third layer comprising aluminum (Al) within the feature atop the second layer to fill the feature, wherein the third layer forms a metal gate electrode.

12. The method of claim 11, wherein the first layer comprises titanium nitride or tantalum nitride.

13. The method of claim 11, wherein the second layer comprises at least one of tantalum, titanium, hafnium, and their alloys with aluminum.

* * * * *